US006846723B2

(12) United States Patent
Ohkubo

(10) Patent No.: US 6,846,723 B2
(45) Date of Patent: Jan. 25, 2005

(54) SEMICONDUCTOR SUBSTRATE, SEMICONDUCTOR DEVICE, AND PROCESSES OF PRODUCTION OF SAME

(75) Inventor: Yasunori Ohkubo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/429,503

(22) Filed: May 5, 2003

(65) Prior Publication Data

US 2004/0007739 A1 Jan. 15, 2004

Related U.S. Application Data

(62) Division of application No. 09/756,412, filed on Jan. 8, 2001, now Pat. No. 6,580,128.

(30) Foreign Application Priority Data

Jan. 7, 2000 (JP) ..................................... P2000-006010

(51) Int. Cl.$^7$ ........................ H01L 21/22; H01L 21/304
(52) U.S. Cl. ........................ 438/455; 438/458; 438/459
(58) Field of Search ........................ 438/347, 455–456, 438/458–459

(56) References Cited

U.S. PATENT DOCUMENTS

| 6,346,459 | B1 | * | 2/2002 | Usenko et al. | ............... | 438/458 |
| 6,352,909 | B1 | * | 3/2002 | Usenko | ..................... | 438/458 |
| 6,597,039 | B2 | * | 7/2003 | Ohmi et al. | ................ | 257/347 |
| 2001/0019877 | A1 | * | 9/2001 | Miyake et al. | .............. | 438/481 |

* cited by examiner

Primary Examiner—Allan R. Wilson
(74) Attorney, Agent, or Firm—Sonnenschein, Nath & Rosenthal, LLP

(57) ABSTRACT

A process of production of a semiconductor substrate having a semiconductor layer on an insulating film formed on a substrate. The process comprises the steps of forming a groove of a predetermined depth having a predetermined pattern in a first substrate made of a semiconductor, forming a first insulating film in the groove and above the first substrate, doping an impurity for peeling off the first substrate into a region of a predetermined depth of the first substrate, bonding a second substrate from above the first insulating film, removing the first substrate in the region with the impurity doped therein by heat treatment while leaving the semiconductor layer of the surface layer of the first substrate on the first insulating film, and polishing the semiconductor layer using as a stopper the surface of the first insulating film shaped projecting out at a bottom of the groove.

24 Claims, 11 Drawing Sheets

SEMICONDUCTOR SUBSTRATE, SEMICONDUCTOR DEVICE, AND PROCESSES OF PRODUCTION OF SAME

RELATED APPLICATION DATA

This application is a divisional of application Ser. No. 09/756,412 filed Jan. 8, 2001, now U.S. Pat. No. 6,580,128. The present and foregoing applications claim priority to Japanese Application No. 2000-006010 filed Jan. 7, 2000.

BACKGROUND OF THE INVENTION

1. Field of the Invention

The present invention relates to a semiconductor substrate and semiconductor device and processes of production of the same, more particularly relates to a semiconductor substrate having a silicon on insulator or semiconductor on insulator (SOI) structure (hereinafter also referred to as an SOI substrate) comprising a substrate having a semiconductor layer on an insulating film and a semiconductor device and processes of production relating to the same.

2. Description of the Related Art

Along with the higher integration and higher performance of large-scale integrated circuits (LSI) mounting metal-oxide-semiconductor field effect transistors (MOSFET), semiconductor devices having an SOI structure have been attracting attention.

In an SOI structure, complete element isolation is achieved by a silicon oxide or other insulating film, so software error and latch up are suppressed and a high reliability is obtained even in an LSI having a high degree of integration. Further, since the junction capacity of a diffusion layer can be reduced, there is less electric charging and electric discharging relating to switching, so there is the advantage of a higher speed and a electric lower power consumption.

Several proposals have been made up to now for the process of production of an SO substrate. There are for example separation by implanted oxygen (SIMOX) and direct bonding such as plasma assisted chemical etching (PACE), bond and etchback SOI (BESOI), polishing a rear surface after bonding as disclosed in Japanese Patent Laid-open No. Hei 10-199840, and a hydrogen ion implantation (smart cut).

In SIMOX, it is relatively easy to make the SOI layer thin, but high concentration oxygen ions are implanted with a high energy, therefore there is the problem that the cost of ion implantation becomes high. Further, remarkable damage of the crystallinity of the silicon semiconductor layer, deterioration of performances of the transistors and other semiconductor elements, and further variations in the thickness of the oxide film in minute regions have been reported. Further, problems such as leakage are manifested along with the reduction of the thickness of the SOI layer.

Further, direct bonding is put to practical use for SOI substrates having SoI layers with thicknesses of 1 to 10 μm.

In PACE, there is a limit in the precision of polishing to eliminate damage, so it is difficult to make the SOI layer thin. Further, since two silicon semiconductor substrates are used, there is the problem of a high manufacturing cost.

In BESOI, ELTRAN (epitaxial layer transfer) using porous silicon obtained by anode oxidation has been developed in recent years. The thickness of the SOI layer is considerably reduced, but there is a problem in the productivity and the supply is unstable. Further, since two silicon semiconductor substrates are also used in this process, the problem of high manufacturing costs remains.

In smart cut, the silicon semiconductor substrate can be reused after peeling, so the manufacturing costs can be suppressed.

Next, an explanation will be made of the process of production of an SOI substrate by smart cut by referring to the drawings.

First, as shown in FIG. 9A, for example, silicon oxide is stacked to a thickness of 200 to 400 nm on a first silicon semiconductor substrate (first substrate) 10 by chemical vapor deposition (CVD) or thermal oxidation to form an insulating film 20.

Next, as shown in FIG. 9B, for example hydrogen ions D are implanted to form a peeling surface 11 in a region at a predetermined depth of the first substrate 10.

Here, the depth of the peeling surface 11 is set to the required thickness of the SOI layer and the thickness of the damage layer (about 200 nm in practice) considering damage at the time of peeling.

Next, the insulating film 20 is polished by for example CMP to flatten the surface.

In this CMP, the insulating film is polished to a surface roughness of a level of 0.4 nm by polishing using a polishing pad made of for example urethane foam or a nonwoven fabric continuous foam and colloidal silica having an average particle size of 40 nm as a polishing slurry to thereby obtain a bondable surface.

Next, as shown in FIG. 9C, a second silicon semiconductor substrate (second substrate) 30 is bonded above the insulating film 20 formed on the first substrate 10. Here, in the figure, the first substrate 10 formed with the insulating film 20 drawn upside down compared with FIG. 9B.

At the time of bonding, in the same way as the first substrate 10, the surface of the second substrate 30 is polished to a surface roughness of a level of 0.4 nm in advance by polishing using a polishing pad made of urethane foam etc. and colloidal silica having an average particle size of 40 nm as the polishing slurry to thereby form a bondable surface. Further, the bonding surfaces, that is, the insulating film 20 surface of the first substrate 10 and the surface of the second substrate 30, are washed (to remove particles on the bonding surfaces) and made hydrophilic (to introduce OH groups into the bonding surfaces) by washing by a mixed washing solution of ammonia water, hydrogen peroxide, and high purity water ($NH_3:H_2O_2:H_2O=1:2:7$). This enables stabilization of the bonding.

Next, as shown in FIG. 10A, first the bonding surfaces are heat treated at about 400° C. in an oxygen or inert gas atmosphere to increase the bonding strength, then are further heat treated at about 600° C. to peel off the first substrate 10b while leaving the semiconductor layer 10a on the insulating film 20 at the peeling surface 11.

The first substrate 10b can be recovered, flattened at its surface, then routinized as the first substrate or another semiconductor substrate.

In order to further raise the bonding strength of the bonding surfaces of the second substrate 30 and the insulating film 20, for example, it is preferable to heat treat them for about 30 minutes to 2 hours at a temperature of 800 to 1100° C. Where an impurity, for example, boron, has been already introduced into the semiconductor layer 10a, preferably the heat treatment is carried out at a low temperature of about 800° C. in order to prevent diffusion.

Next, as shown in FIG. 10B, for example CMP is used to polish the semiconductor layer 10a by 200 nm, corresponding to the damage layer, to eliminate the damage at the time of peeling and flatten the surface of the semiconductor layer to obtain the intended SOI substrate.

In this CMP, polishing is applied using for example a nonwoven fabric type continuous foam or urethane foam as the polishing pad and using colloidal silica having an average particle size of 40 nm or an ethylene diamine solution as the polishing slurry so as to obtain the surface roughness and the SOI layer thickness required for the LSI device.

Summarizing the problems to be solved by the invention, in the process of production of an SOI substrate by hydrogen ion implantation (smart cut), due to the limited precision of the polishing step for eliminating the damage layer, the thickness of the SOI layer can only be reduced to about 100 nm. Therefore, when the semiconductor device is miniaturized and the design rule becomes 0.1 $\mu$m, the demanded reduction of the thickness of the SOI layer to about 30 to 50 nm cannot be realized.

In the method of polishing the rear surface after bonding disclosed in Japanese Patent Laid-open No. Hei 10-199840, the semiconductor substrate is formed by forming a film acting as a stopper of the polishing, bonding the silicon semiconductor substrates, then polishing the rear surface, but the film acting as the stopper of the polishing is formed with a specific pattern such as the pattern of the element isolation insulating film. Therefore there is the problem in that a general purpose SOI substrate cannot be formed.

Further, in this method, two silicon semiconductor substrates are used, so there is the problem of high manufacturing costs. Further the thick silicon semiconductor substrate must be polished from the rear surface, so there is the problem of variation of the thickness of the SOI layer depending on the polishing precision.

SUMMARY OF THE INVENTION

An object of the present invention is to provide a semiconductor substrate having an SOI structure suitable for general purpose use even through structured isolating an SOI layer by an insulating film.

Another object of the present invention is to provide a process of production of a semiconductor substrate of an SOI structure which enables a reduction of the thickness of the SOI layer and enables suppression of the manufacturing costs and variation of the SOI layer thickness.

Still another object of the present invention is to provide a semiconductor device using the above semiconductor substrate.

Still another object of the present invention is to provide a process of production of such a semiconductor device.

To attain the first object, according to a first aspect of the present invention, there is provided a semiconductor substrate for forming a circuit pattern of a semiconductor chip, comprising a substrate, an insulating film formed on the substrate, and a semiconductor layer formed on the insulating film, the semiconductor layer being isolated by the insulating film for every region of formation of a circuit pattern of a semiconductor chip.

Preferably, a conductive film is formed in the insulating film in a lower portion of the semiconductor layer.

According to this aspect of the invention, despite the semiconductor substrate being one for forming a circuit pattern of a semiconductor chip having a semiconductor layer on an insulating film formed on a substrate, since the semiconductor layer is isolated by the insulating film for every region of formation of a circuit pattern of a semiconductor chip, it is not limited to a special element isolation pattern. Even if a structure where a semiconductor layer having an SOI structure is isolated by an insulating film is employed, it is possible to apply the same for general purpose use.

To attain the second object, according to a second aspect of the present invention, there is provided a process of production of a semiconductor substrate having a semiconductor layer on an insulating film formed on a substrate, comprising the steps of forming a groove of a predetermined depth having a predetermined pattern in a first substrate made of a semiconductor, forming a first insulating film in the groove and above the first substrate, doping an impurity for peeling off the first substrate into a region of a predetermined depth of the first substrate, bonding a second substrate from above the first insulating film, removing the first substrate in the region with the impurity doped therein by heat treatment while leaving the semiconductor layer of the surface layer of the first substrate on the first insulating film, and polishing the semiconductor layer using as a stopper the surface of the first insulating film shaped projecting out at a bottom of the groove.

Preferably, the step of forming the groove includes a step of forming a groove of a predetermined depth in an outer circumferential region of the circuit pattern of the semiconductor chip formed in the semiconductor layer.

Preferably, the step of forming the groove includes a step of determining the depth of the groove so that the thickness of the semiconductor layer obtained after the step of polishing the semiconductor layer becomes a predetermined thickness.

Preferably, the step of forming the first insulating film includes a step of forming the first insulating film by an insulating material with a polishing rate slower than the first substrate.

More preferably, a silicon semiconductor substrate is used as the first substrate and the first insulating film is formed by silicon oxide.

Preferably, the step of forming the first insulating film includes a step of flattening the first insulating film.

More preferably, the step of flattening the first insulating film is a chemical mechanical polishing step.

Preferably, in the step of doping the impurity for peeling off the first substrate, the implanting of hydrogen ions is carried out.

Preferably, the step of polishing the semiconductor layer is a chemical mechanical polishing step.

Preferably, the process further comprises, after the step of forming the first insulating film and before the step of doping the impurity for peeling off the first substrate, a step of forming a conductive film above the first insulating film and a step of forming a second insulating film above the conductive film.

More preferably, the step of forming the second insulating film includes a step of flattening the second insulating film and further preferably, the step of flattening the second insulating film is a chemical mechanical polishing step.

That is, the process of production of the semiconductor substrate comprises forming in a first substrate made of a semiconductor a groove of a predetermined depth having a predetermined pattern at an outer circumferential region of a circuit pattern of a semiconductor chip to be formed on the semiconductor layer, forming a first insulating film in the groove and above the first substrate, and flattening the first insulating film surface by chemical mechanical polishing or the like.

Next, it dopes an impurity such as hydrogen ions for peeling off the first substrate into a region of a predetermined depth of the first substrate.

Next, it bonds a second substrate from above the first insulating film and performs heat treatment to peel off the first substrate in the region with the impurity doped while leaving the semiconductor layer of the surface layer portion of the first substrate on the first insulating film.

Next, it polishes the semiconductor layer by chemical mechanical polishing or the like using as a stopper the surface of the first insulating film shaped projecting out in the bottom of the groove.

According to the process of production of the semiconductor substrate, since, as described above, the semiconductor layer is polished by using as a stopper the surface of the first insulating film shaped projected out in the bottom of the groove, reduction of the thickness of the SOI layer in accordance with the depth of the groove is possible and a thickness of for example 30 to 50 nm can be achieved.

Further, the substrate can be reused after it is peeled off, therefore the manufacturing costs can be suppressed. Further, since only a polishing variation of an amount of the thickness of the film peeled off in the peeling layer occurs and the stopper is used in the polishing as described above, variation of the SOI layer thickness can be suppressed.

FIG. 11A is a plan view of a semiconductor substrate (SOI substrate) according to another embodiment. FIG. 11B is a cross sectional view taken along the line A–A' in FIG. 11A.

The semiconductor wafer W illustrated in FIGS. 11A and 11B is identical in all aspects to that shown in FIGS. 5A and 5B except that it lacks the lower layer insulating film 21 and comprises a conductive film 12 formed directly on the bonding surface of the support substrate 30.

Further, by forming the conductive film above the first insulating film and forming the second insulating film above the conductive film after the step of forming the first insulating film and before the step of doping the impurity for peeling off the first substrate, a semiconductor substrate of an SOI structure capable of forming a semiconductor element of a back gate structure can be manufactured.

To attain the third object, according to a third aspect of the present invention, there is provided a semiconductor device obtained from the semiconductor substrate of the first aspect of the invention.

To attain the fourth object, according to a fourth aspect of the present invention, there is provided a process of production of a semiconductor device obtained from the semiconductor substrate of the first aspect of the invention.

BRIEF DESCRIPTION OF THE DRAWINGS

These and other objects and features of the present invention will become clearer from the following description of the preferred embodiments given with reference to the accompanying drawings, in which:

FIGS. 2A to 2C are cross sectional views of steps of a process of production of the semiconductor substrate according to the first embodiment, wherein FIG. 2A shows the state up to a step of forming a groove, FIG. 2B shows the state up to a step of forming an insulating film, and FIG. 2C shows the state up to a step of flattening the insulating film;

FIGS. 3A and 3B show steps continuing from to FIG. 2C, wherein FIG. 3A shows the state up to a step of forming a peeling layer, and FIG. 3B shows the state up to a step of bonding a support substrate;

FIGS. 4A and 4B show steps continuing from FIG. 3B, wherein FIG. 4A shows the state up to a step of peeling off the peeling layer by heat treatment, and FIG. 4B shows the state up to the step of forming a semiconductor layer of an SOI structure by polishing;

FIGS. 6A to 6C are cross sectional views of steps of a process of production of the semiconductor substrate according to the second embodiment, wherein FIG. 6A shows the state up to the step of flattening an upper layer insulating film, FIG. 6B shows the state up to a step of forming a conductive film, and FIG. 6C shows up to a step of forming a lower layer insulating film;

FIGS. 7A and 7B show steps continuing from FIG. 6C, wherein FIG. 7A shows the state up to a step of forming a peeling layer, and FIG. 7B shows the state up to a step of bonding a support substrate;

FIGS. 8A and 8B show steps continuing from FIG. 7B, wherein FIG. 8A shows the state up to the step of peeling off the peeling layer by heat treatment, and FIG. 8B shows the state up to the step of forming the semiconductor layer of the SOI structure by polishing;

FIGS. 9A to 9C are cross sectional views of steps of a process of production of a semiconductor substrate according to the related art, wherein FIG. 9A shows the state up to the step of flattening the insulating film, FIG. 9B shows the state up to the step of forming the peeling layer, and FIG. 9C shows the state up to the step of bonding the support substrate; and FIGS. 10A and 10B show steps continuing from FIG. 9C, wherein FIG. 10A shows the state up to the step of peeling off the peeling layer by heat treatment, and FIG. 10B shows the state up to the step of forming a semiconductor layer of the SOI structure by polishing.

DESCRIPTION OF THE PREFERRED EMBODIMENTS

Figure 1A:
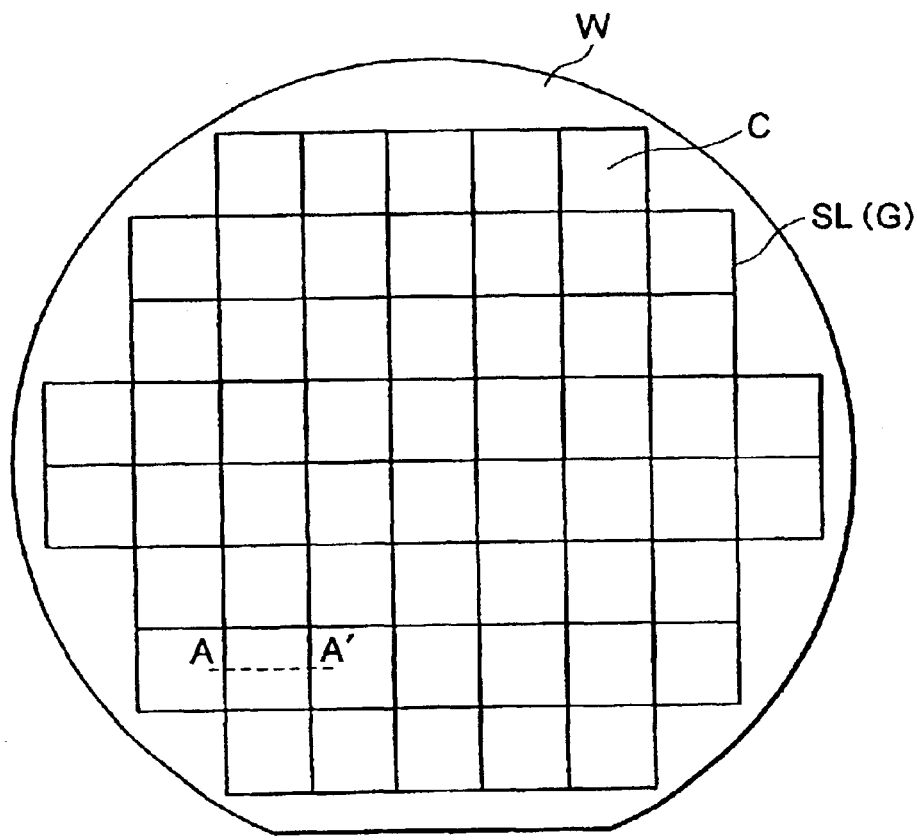
FIG. 1A is a plan view of a semiconductor substrate according to a first embodiment of the present invention.

Below, an explanation will be given of embodiments of the present invention by referring to the drawings.

First Embodiment

FIG. 1A is a plan view of a semiconductor substrate (SOI substrate) according to the present embodiment.

The semiconductor wafer W is comprised of a substrate, an insulating film formed on the substrate, and a semiconductor layer on the insulating film.

The wafer comprises structure G comprised of the insulating film projecting out to the surface at the outer circumferential regions of the circuit patterns of a plurality of semiconductor chips which will be formed in the semiconductor layer, which become scribe lines SL when dicing to the individual semiconductor chips after formed with the circuit patterns of the semiconductor chips. This isolates the semiconductor layer for every region C where a circuit pattern of a semiconductor chip will be formed.

Figure 1B:
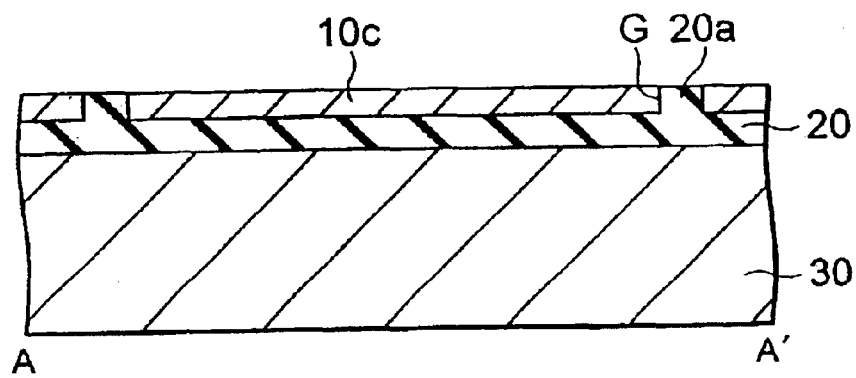
FIG. 1B is a cross sectional view along the line A–A' in FIG. 1A.

FIG. 1B is a cross sectional view taken along the line A–A' in FIG. 1A.

An insulating film 20 made of for example silicon oxide is formed on the bonding surface of a support substrate 30 made of for example silicon. A silicon semiconductor layer (SOI layer) 10c having an SOI structure is formed at the upper layer of the insulating film 20.

The SOI layer 10c has a structure G comprised of the insulating film projecting out to the surface at the outer circumferential region of the circuit pattern of each semiconductor chip which will be formed in the semiconductor layer. Due to this, the semiconductor layer 10c is isolated for every region where a circuit pattern of a semiconductor chip will be formed.

The semiconductor substrate of the present embodiment is a semiconductor substrate comprising a semiconductor layer above an insulating film formed in a substrate, and since the semiconductor layer 10c is isolated by the insulating film for every region C where the circuit pattern of a semiconductor chip will be formed, the substrate is not limited to any specific element isolation pattern and can be applied for general purpose use despite the semiconductor layer 10c of the SOI structure being isolated by the insulating film 20.

Further, it is also possible to form a semiconductor element in the semiconductor substrate by using well known techniques.

Next, an explanation will be made of the process of production of the SOI substrate by referring to the sectional view taken along the line A–A' in FIG. 1A.

Figure 2A:
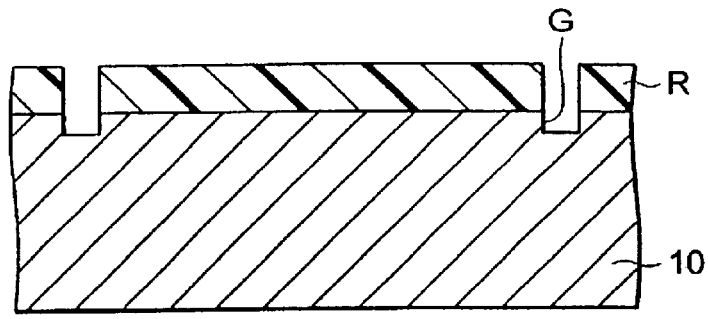

First, as shown in FIG. 2A, a resist film R is formed on the first silicon semiconductor substrate (first substrate) 10 by for example photolithography. This is then etched by for example reactive ion etching (RIE) using for example a flow rate of a $CF_4$ gas of 100 sccm and a flow rate of an Ar gas of 900 sccm to form grooves G having a width of 100 μm and a depth of 50 nm in the first substrate 10.

Here, the grooves G are formed in a lattice-like pattern of for example a 20 mm pitch in the outer circumferential regions of the circuit patterns of the semiconductor chips which will be formed in the semiconductor layer of the SOI substrate. This pitch may also be made the size of one side of a semiconductor chip when dicing the semiconductors later.

Figure 2B:
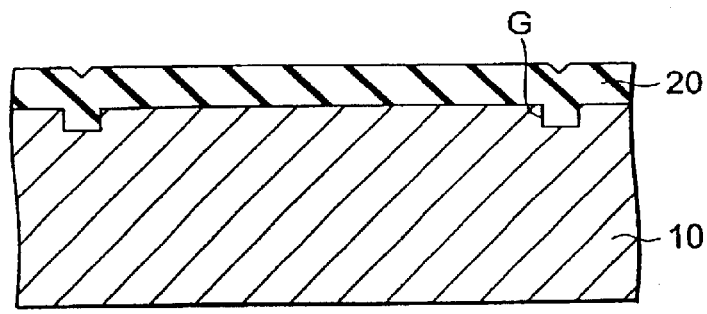

Next, as shown in FIG. 2B, silicon oxide is deposited in the grooves G and on the first substrate 10 to a thickness of for example 400 nm by for example the chemical vapor deposition (CVD) to form the insulating film 20.

Figure 2C:
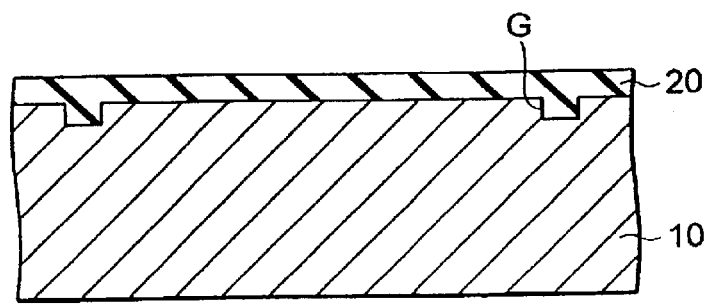

Next, as shown in FIG. 2C, the insulating film 20 is polished by for example the chemical mechanical polishing (CMP) to flatten the surface.

In the CMP, the insulating film 20 is polished by using for example polyurethane foam as the polishing pad and colloidal silica having an average particle size of 80 nm as the polishing slurry to eliminate step differences in on the surface of the insulating film 20 and is further polished by using a nonwoven fabric type continuous foam or other polishing pad and using colloidal silica having an average particle size of 40 nm as the polishing slurry to obtain a surface roughness of a level of 0.4 nm and obtain a bondable surface.

Figure 3A:
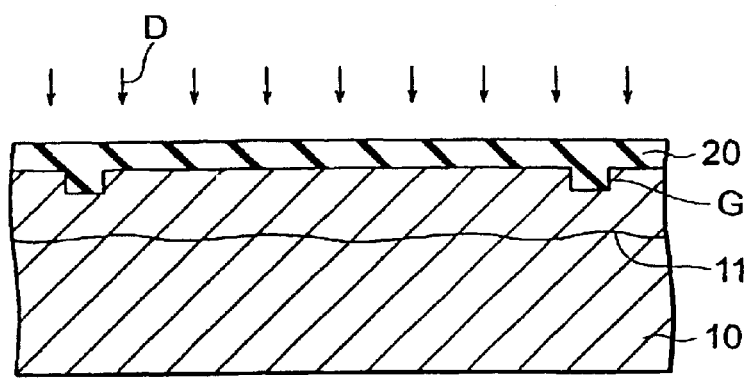

Next, as shown in FIG. 3A, for example hydrogen ions D are implanted to form a peeling surface 11 in the region of a predetermined depth of the first substrate 10.

Here, the depth of the peeling surface 11 is set to for example a depth of about 200 nm from the bottom of the grooves G considering the damage at the time of peeling. Namely, when assuming that the depth of the grooves is 50 nm and the thickness of the insulating film 20 after the polishing is 200 nm, the peeling surface 11 is formed at a depth of 450 nm in total from the surface of the insulating film 20.

It is also possible to change the order of the step of forming the peeling surface by the introduction of an impurity and the step of polishing for obtaining a finished bonding surface.

Figure 3B:
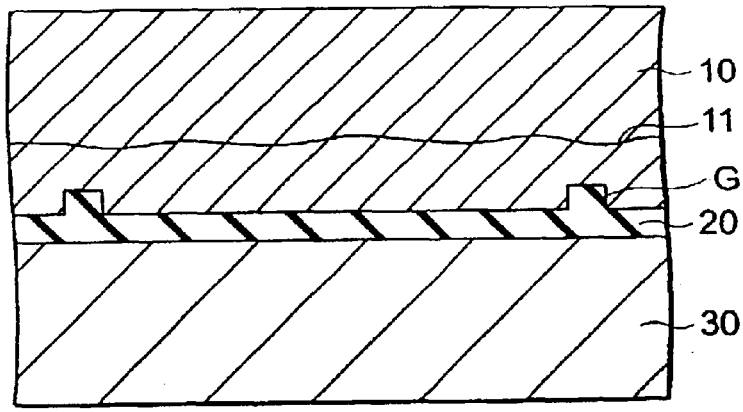

Next, as shown in FIG. 3B, the second silicon semiconductor substrate (second substrate) 30 is bonded above the insulating film 20 formed on the first substrate 10. Here, in the figure, the first substrate 10 formed with the insulating film 20 is drawn upside down compared with FIG. 3A.

At the time of bonding, in the same way as the first substrate 10, the surface of the second substrate 30 is polished to give a bondable surface. Further, it is washed by a mixed washing solution comprised of ammonia water, hydrogen peroxide, and high purity water ($NH_3:H_2O_2:H_2O=$ 1:2:7) to wash the bonding surfaces, that is, the surface of the insulating film 20 of the first substrate 10 and the surface of the second substrate 30 (to remove particles from the bonding surfaces) and made them hydrophilic (to introduce OH groups into the bonding surfaces). This enables stabilization of the bonding.

Figure 4A:
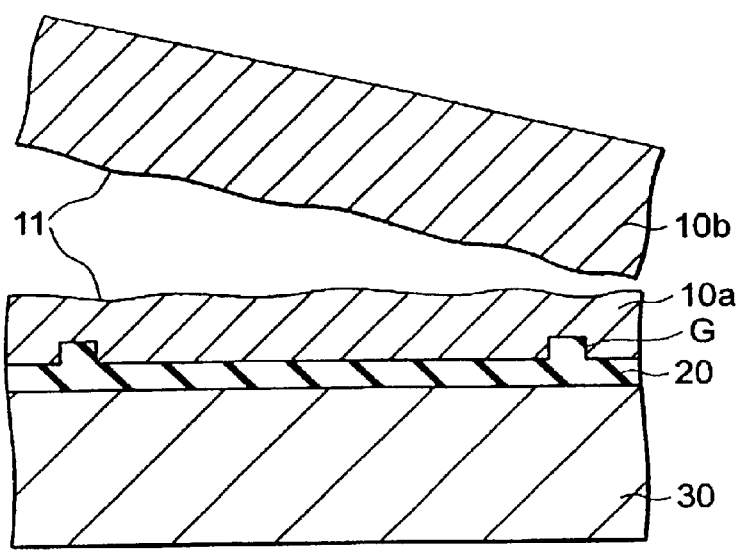

Next, as shown in FIG. 4A, first the bonding surfaces are heat treated at about 400° C. in an oxygen or inert gas atmosphere to increase the bonding strength, then are further heat treated at about 600° C. to peel off the first substrate 10b at the peeling surface 11 while leaving the semiconductor layer 10a on the insulating film 20.

The first substrate 10b can be recovered, flattened at its surface, then routinized as the first substrate or another semiconductor substrate.

In order to further raise the bonding strength of the bonding surfaces of the second substrate 30 and the insulating film 20, for example, it is preferable to heat treat them for about 30 minutes to 2 hours at a temperature of 800 to 1100° C. Where an impurity, for example, boron, has been already introduced into the semiconductor layer 10a, preferably the heat treatment is carried out at a low temperature of about 800° C. in order to prevent diffusion.

Figure 4B:
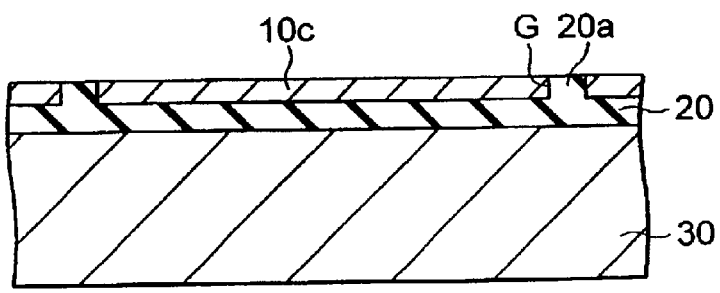

Next, as shown in FIG. 4B, for example CMP is used to polish the semiconductor layer 10a by 200 nm, using the surface of the insulating film portion 20a buried in the grooves G as a stopper, to eliminate the damage at the time of peeling and flatten the surface of the semiconductor layer to obtain the intended SOI substrate shown in FIG. 1.

In this CMP, polishing is applied using for example a nonwoven fabric type continuous foam or urethane foam as the polishing pad and using colloidal silica having an average particle size of 40 nm or an ethylene diamine solution as the polishing slurry so as to obtain the surface roughness and the SOI layer thickness required for the LSI device.

In the CMP, the insulating film portion 20a buried in the grooves G formed in the first substrate 10 in advance is shaped projecting upward from the surface of the second substrate 30. The silicon oxide of the insulating film 20 has a smaller polishing rate ratio compared with the silicon of the semiconductor layer 10a. Therefore, it is possible to polish the semiconductor layer 10a by using the surface of the insulating film portion 20a buried in the grooves G as a stopper.

As a result of the polishing, a semiconductor layer (SOI layer) 10c isolated for every region where the circuit pattern of the semiconductor chip will be formed by the insulating film 20 as shown in FIG. 4B can be obtained. The insulating film portion 20a buried in the grooves G can be used as the scribe lines SL when dicing the individual semiconductor chips after forming the circuit patterns of the semiconductor chips on the SOI substrate obtained as described above.

The thickness of the SOI layer 10c can be controlled so as to correspond to the depth of the grooves G, while depending to the conditions of the polishing, since the surface of the insulating film portion 20a buried in the grooves G is used as the stopper. For example, the thickness of the SOI layer 10c can be controlled to about 50 nm by setting the depth of the grooves G to 50 nm. Further, it is also possible to form a semiconductor element in the semiconductor substrate by using already known techniques.

According to the process of production of the semiconductor substrate of the present embodiment, the semiconductor layer is polished using the surface of the insulating film portion 20a buried in the grooves G as described above (the insulating film 20 portion shaped projecting out in the bottom of the grooves G) as a stopper, therefore a reduction of the thickness of the SOI layer in accordance with the depth of the grooves is possible and a thickness of for example 30 to 50 nm can be achieved.

Further, the substrate can be reused after it is peeled off, therefore the manufacturing costs can be suppressed. Further, since only a polishing variation of an amount of the thickness of the film peeled off in the peeling layer occurs and the stopper is used in the polishing as described above, variation of the SOI layer thickness can be suppressed.

Second Embodiment

Figure 5A:
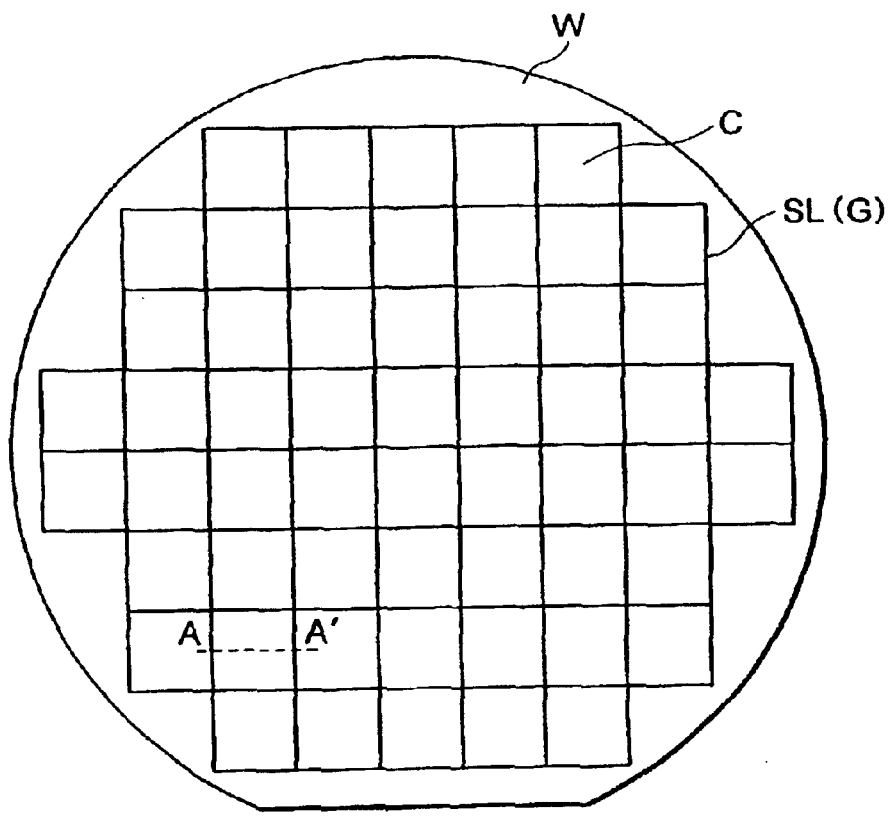
FIG. 5A is a plan view of a semiconductor substrate according to a second embodiment of the present invention.
Figure 5B:
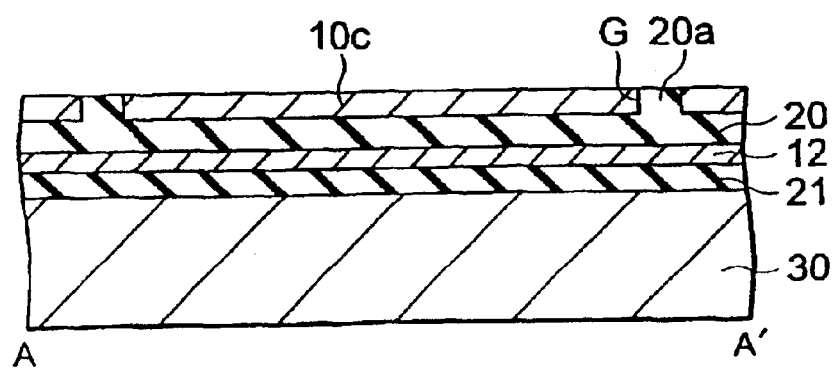
FIG. 5B is a cross sectional view along the A–A' in FIG. 5A.

FIG. 5A is a plan view of a semiconductor substrate (SOI substrate) according to the present embodiment, while FIG. 5B is a sectional view taken along the line A–A' in FIG. 5A.

The SOI substrate according to the present embodiment is substantially the same as the SOI substrate according to the first embodiment, but a lower layer insulating film 21 made of for example silicon oxide is formed on the top of the bonding surface of the support substrate 30, a conductive film 12 made of for example polysilicon is formed at the upper layer of the support substrate 30, an upper layer insulating film 20 made of for example silicon oxide is formed on the top surface of the conductive film 12, and a silicon semiconductor layer (SOI layer) 10c of an SOI structure is formed at the upper layer of the upper layer insulating film 20.

The SOX layer 10c has the structure G comprised of the upper layer insulating film 20 projecting out to the surface in the outer circumferential region of the circuit pattern of each semiconductor chip which will be formed in the semiconductor layer. Due to this, the semiconductor layer 10c is isolated for every region where the circuit pattern of the semiconductor chip will be formed.

The semiconductor substrate of the present embodiment, in the same way as the first embodiment, is a semiconductor substrate comprising a semiconductor layer above an insulating film formed in a substrate, and since the semiconductor layer 10c is isolated by the insulating film for every region C where the circuit pattern of a semiconductor chip will be formed, the substrate is not limited to any specific element isolation pattern and can be applied for general purpose use despite the semiconductor layer 10c of the SOI structure being isolated by the insulating film 20.

Further, it is also possible to form a semiconductor element in the semiconductor substrate by using well known techniques.

Next, an explanation will be made of the process of production of the SOI substrate by referring to the sectional view taken along the line A–A' in FIG. 5A.

Figure 6A:
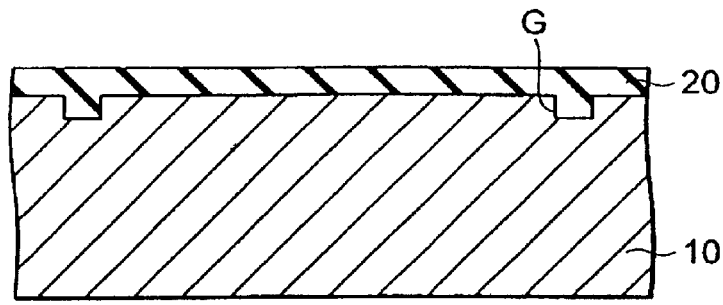

First, the structure up to that shown in FIG. 6A is formed in the same way as the first embodiment.

Namely, grooves G of for example a width of 100 μm and a depth of 50 nm are formed in the surface of the first silicon semiconductor substrate (first substrate) 10 in a lattice-like pattern of for example 20 mm pitch in the outer circumferential regions of the circuit patterns of the semiconductor chips which will be formed in the semiconductor layer of the SOI substrate. Silicon oxide is deposited in the grooves G and on the first substrate 10 to a thickness of 400 nm by for example CVD to form the upper layer insulating film 20. Further, the upper layer insulating film 20 is polished by CMP to flatten the surface.

In the CMP, the upper layer insulating film 20 is polished by using for example polyurethane foam as the polishing pad and colloidal silica having an average particle size of 80 nm as the polishing slurry to polishing away 200 nm of the surface of the upper layer insulating film 20 and eliminate step differences.

Figure 6B:
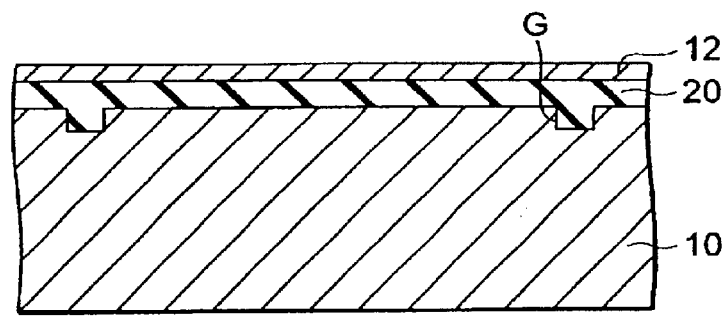

Next, as shown in FIG. 6B, polysilicon is deposited above the upper layer insulating film 20 to a thickness of 300 nm by for example CVD to form the conductive film 12.

The polysilicon is given conductivity by mixing a conductive impurity into the reaction gas during the position so as to cause inclusion of impurities in the film or by implanting ions of impurities after deposition.

Figure 6C:
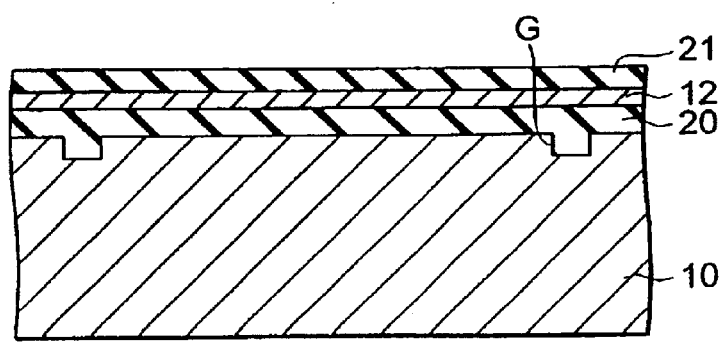

Next, as shown in FIG. 6C, silicon oxide is deposited to a thickness of 300 to 400 nm by for example CVD to form the lower layer insulating film 21.

Next, the surface of the lower layer insulating film 21 is polished using a nonwoven fabric type continuous foam or other polishing pad and using colloidal silica of an average particle size of 40 nm as the polishing slurry to a surface roughness of the level of 0.4 nm to obtain a bondable surface.

Figure 7A:
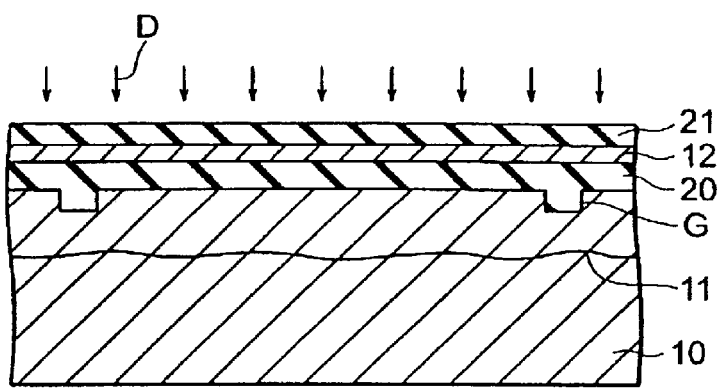

Next, as shown in FIG. 7A, for example, hydrogen ions D are implanted to form a peeling surface 11 in the region of a predetermined depth of the first substrate 10.

Here, in the same way as the first embodiment, the depth of the peeling surface 11 is set to for example a depth of about 200 nm from the bottom of the groove G considering the damage at the time of peeling.

It is also possible to change the order of the step of forming the peeling surface by the introduction of an impurity and the step of polishing for obtaining a finished bonding surface.

Figure 7B:
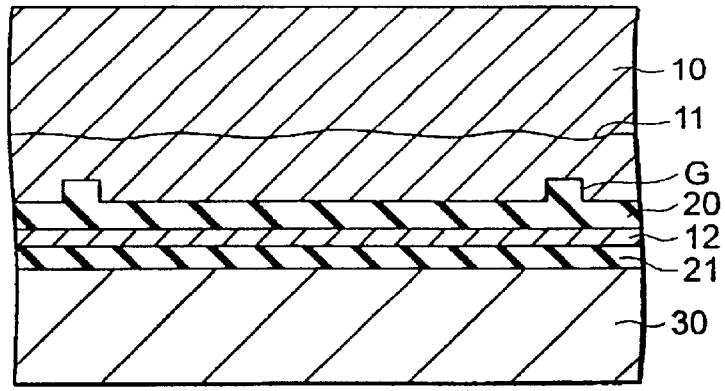

Next, as shown in FIG. 7B, the second silicon semiconductor substrate (second substrate) 30 is bonded above the lower layer insulating film 21 formed on the first substrate 10. Here, in the figure, the first substrate 10 formed with the upper layer insulating film 20, conductive film 12, and lower layer insulating film 21 is drawn upside down compared with FIG. 7A.

At the time of bonding, in the same way as the first substrate 10, the surface of the second substrate 30 is polished to give a bondable surface. Further, it is washed by a mixed washing solution comprised of ammonia water, hydrogen peroxide, and high purity water ($NH_3:H_2O_2:H_2O=1:2:7$) to wash the bonding surfaces, that is, the surface of the lower layer insulating film 21 of the first substrate 10 and the surface of the second substrate 30 (to remove particles from the bonding surfaces) and made them hydrophilic (to introduce OH groups into the bonding surfaces). This enables stabilization of the bonding.

Figure 8A:
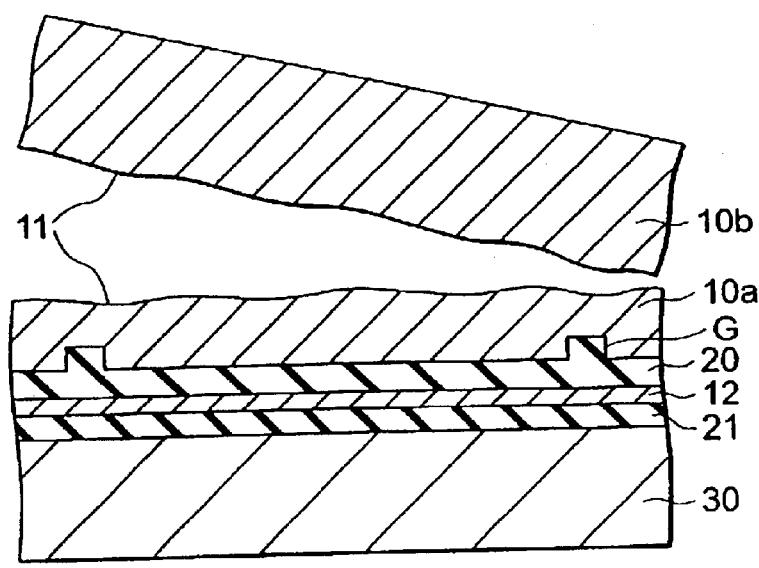

Next, as shown in FIG. 8A, first the bonding surfaces are heat treated at about 400° C. in an oxygen or inert gas atmosphere to increase the bonding strength, then are further heat treated at about 600° C. to peel off the first substrate 10b at the peeling surface 11 while leaving the semiconductor layer 10a on the upper layer insulating film 20.

The first substrate 10b can be recovered, flattened at its surface, then routinized as the first substrate or another semiconductor substrate.

In order to further raise the bonding strength of the bonding surfaces of the second substrate 30 and the lower layer insulating film 21, for example, it is preferable to heat treat them for about 30 minutes to 2 hours at a temperature of 800 to 1100° C. Where an impurity, for example, boron, has been already introduced into the semiconductor layer 10a, preferably the heat treatment is carried out at a low temperature of about 800° C. in order to prevent diffusion.

Figure 8B:
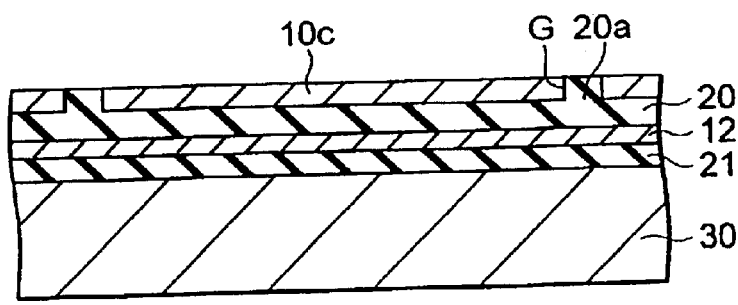
Figure 9A:
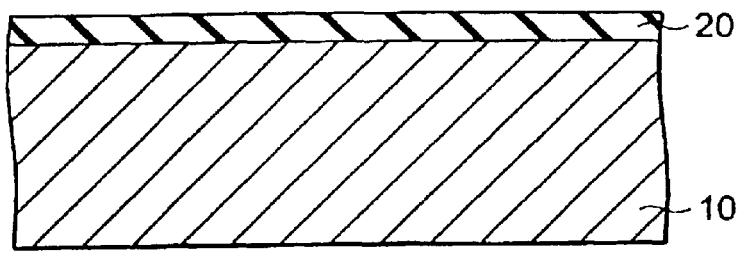
Figure 9B:
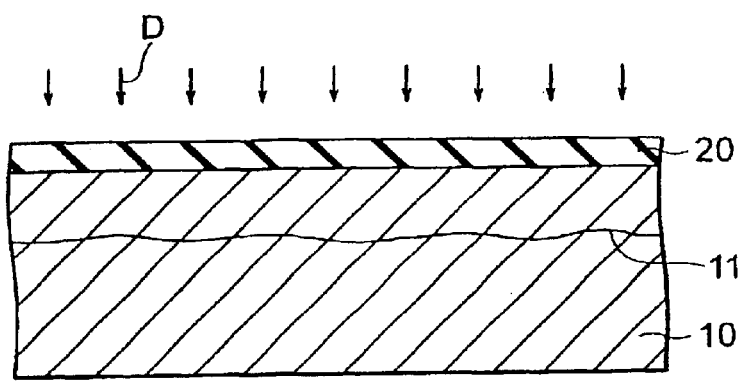
Figure 9C:
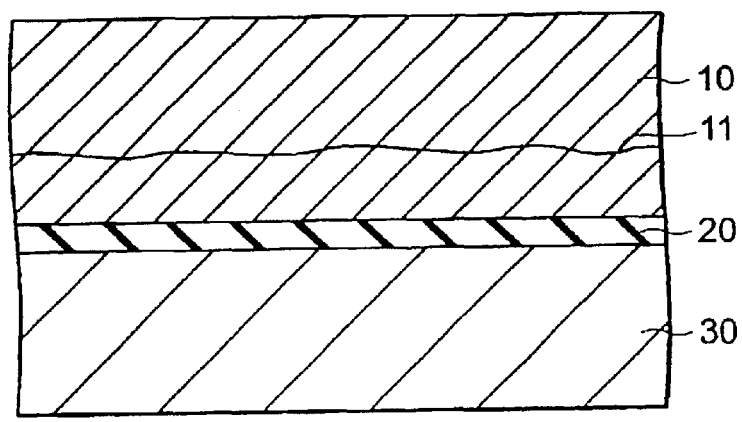
Figure 10A:
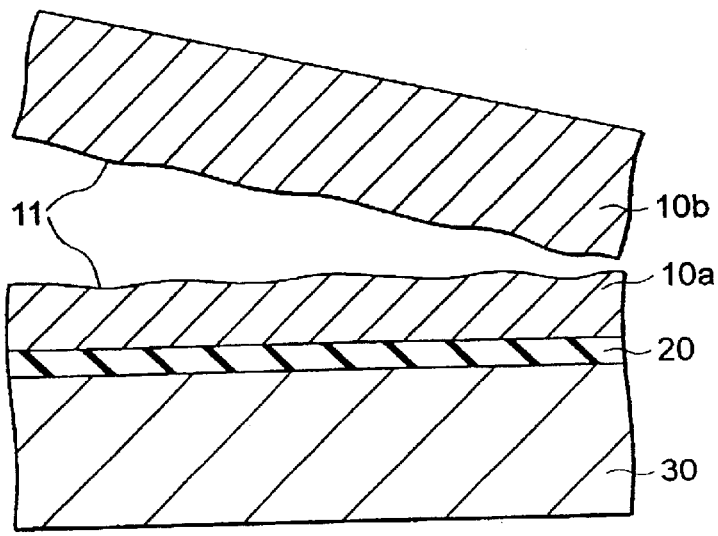
Figure 10B:
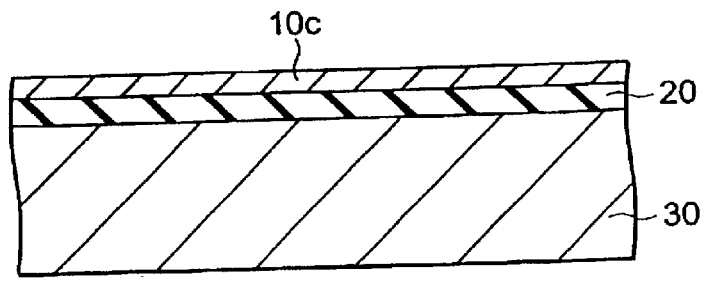

Next, as shown in FIG. 8B, for example CMP is used to polish the semiconductor layer 10a by 200 nm, using the surface of the upper layer insulating film portion 20a buried in the grooves G as a stopper, to eliminate the damage at the time of peeling and flatten the surface of the semiconductor layer to obtain the intended SOI substrate shown in FIG. 5.

In this CMP, polishing is applied using for example a nonwoven fabric type continuous foam or urethane foam as the polishing pad and using colloidal silica having an average particle size of 40 nm or an ethylene diamine solution as the polishing slurry so as to obtain the surface roughness and the SOI layer thickness required for the LSI device.

In the CMP, the upper layer insulating film portion 20a buried in the grooves G formed in the first substrate 10 in advance is shaped projecting upward from the surface of the second substrate 30. The silicon oxide of the insulating film 20 has a smaller polishing rate ratio compared with the silicon of the semiconductor layer 10a. Therefore, it is possible to polish the semiconductor layer 10a by using the surface of the upper layer insulating film portion 20a buried in the grooves G as a stopper.

As a result of the polishing, a semiconductor layer (SoI layer) 10c isolated for every region where the circuit pattern of the semiconductor chip will be formed by the upper layer insulating film 20 as shown in FIG. 4B can be obtained. The upper layer insulating film portion 20a buried in the grooves G can be used as the scribe lines SL when dicing the individual semiconductor chips after forming the circuit patterns of the semiconductor chips on the SOI substrate obtained as described above.

The thickness of the SOI layer 10c can be controlled so as to correspond to the depth of the grooves G, while depending to the conditions of the polishing, since the surface of the upper layer insulating film portion 20a buried in the grooves G is used as the stopper. For example, the thickness of the SOI layer 10c can be controlled to about 50 nm by setting the depth of the grooves G to 50 nm.

Further, it is also possible to form a semiconductor element in the semiconductor substrate by using already known techniques.

According to the process of production of the semiconductor substrate of the present embodiment, the semiconductor layer is polished using the surface of the upper layer insulating film portion 20a buried in the grooves G as described above (the upper layer insulating film 20 portion shaped projecting out in the bottom of the grooves G) as a stopper, therefore a reduction of the thickness of the SOI layer in accordance with the depth of the grooves is possible and a thickness of for example 30 to 50 nm can be achieved.

Further, the substrate can be reused after it is peeled off, therefore the manufacturing costs can be suppressed. Further, since only a polishing variation of an amount of the thickness of the film peeled off in the peeling layer occurs and the stopper is used in the polishing as described above, variation of the SOI layer thickness can be suppressed.

Further, the conductive film is formed between the upper layer insulating film and the lower layer insulating film. Due to this, a semiconductor substrate of the SOI structure capable of forming a semiconductor element of a back gate structure can be manufactured.

The semiconductor device formed using the semiconductor substrate of the present invention can be any device so far as it has the semiconductor element in the SOI type semiconductor layer. It may have for example a MOSFET or other various semiconductor elements.

The present invention is not limited to the embodiments.

For example, the pattern of isolating the SOI layer by the insulating film is not limited to every region where a circuit pattern of a semiconductor chip will be formed. It is also possible to change it to isolation for every region where a plurality of semiconductor chips will be formed.

Further, the upper layer insulating film, lower layer insulating film or other insulating film, or conductive film may each be configured as a single layer or multiple layers.

Other various modifications can be made within the range not out of the gist of the present invention.

Summarizing the effects of the invention, according to the semiconductor substrate of the present invention, in a semiconductor substrate for forming the circuit pattern of a semiconductor chip comprised of a substrate, an insulating layer on the substrate, and a semiconductor layer on the insulating film, the semiconductor layer is isolated by the insulating film for every region where the circuit pattern of a semiconductor chip will be formed, therefore it is not limited to a specific element isolation pattern and can be applied for general purpose use even if isolating the semiconductor layer of the SOI structure by the insulating film.

Further, according to the process of production of the semiconductor substrate of the present invention, the semiconductor layer is polished by using the surface of the insulating film portion buried in the grooves as a stopper, therefore a reduction of the thickness of the SOI layer up to about 30 to 50 nm is possible in accordance with the depth of the groove.

Further, the substrate can be reused after it is peeled off, therefore the manufacturing costs can be suppressed. Further, since only a polishing variation of an amount of the thickness of the film peeled off in the peeling layer occurs and the stopper is used in the polishing as described above, variation of the SOI layer thickness can be suppressed.

Figure 11A:
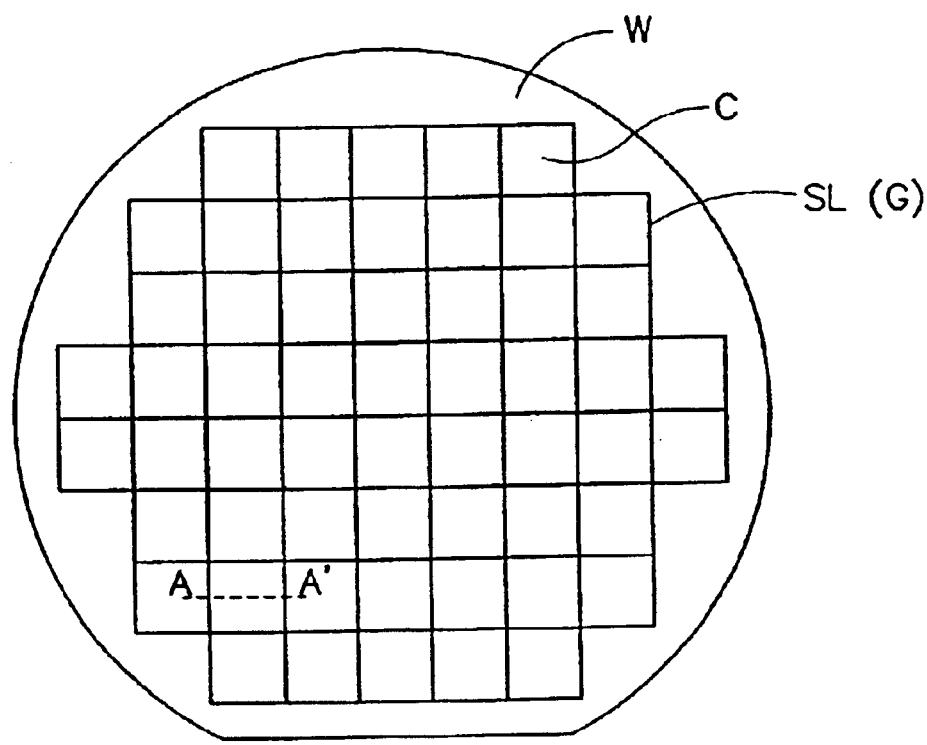
FIG. 11A is a plan view of a semiconductor substrate according to another embodiment of the present invention.
Figure 11B:
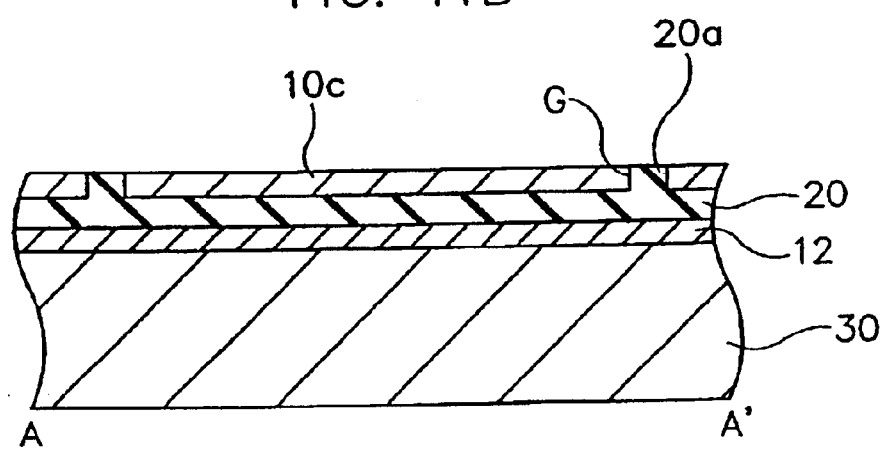
FIG. 11B is a cross sectional view along the line A—A' in FIG. 11A.

FIG. 11A is a plan view of a semiconductor substrate (SOI substrate) according to another embodiment. FIG. 11B is a cross sectional view taken along the line A—A' in FIG. 11A.

The semiconductor wafer W illustrated in FIGS. 11A and 11B is identical in all respects to that shown in FIGS. 5A and 5B except that it lacks the lower layer insulating film 21 and comprises a conductive film 12 formed directly on the bonding surface of the support substrate 30.

What is claimed is:

1. A process of production of a semiconductor substrate having a semiconductor layer on an insulating film formed on a substrate, comprising the steps of:

forming a groove of a predetermined depth having a predetermined pattern in a first substrate made of a semiconductor, forming a first insulating film in said groove and above said first substrate, doping an impurity for peeling off said first substrate into a region of a predetermined depth of said first substrate, bonding a second substrate from above said first insulating film, removing said first substrate in the region with said impurity doped therein by heat treatment while leaving the semiconductor layer of the surface layer of said first substrate on said first insulating film, and polishing said semiconductor layer using as a stopper the surface of said first insulating film shaped projecting out at a bottom of said groove.

2. A process of production of a semiconductor substrate as set forth in claim 1, wherein the step of forming said groove includes a step of forming a groove of a depth of 30 to 50 nm in an outer circumferential region of the circuit pattern of the semiconductor chip formed in said semiconductor layer.

3. A process of production of a semiconductor substrate as set forth in claim 1, wherein the step of forming said groove includes a step of determining the depth of said groove so that the thickness of said semiconductor layer obtained after the step of polishing said semiconductor layer becomes a predetermined thickness.

4. A process of production of a semiconductor substrate as set forth in claim 1, wherein the step of forming said first insulating film includes a step of forming the first insulating film by an insulating material with a polishing rate slower than said first substrate.

5. A process of production of a semiconductor substrate as set forth in claim 4, wherein a silicon semiconductor substrate is used as said first substrate and said first insulating film is formed by silicon oxide.

6. A process of production of a semiconductor substrate as set forth in claim 1, wherein the step of forming said first insulating film includes a stop of flattening the first insulating film.

7. A process of production of a semiconductor substrate as set forth in claim 6, wherein the stop of flattening said first insulating film is a chemical mechanical polishing step.

8. A process of production of a semiconductor substrate as set forth in claim 1, wherein in the step of doping the impurity for peeling off said first substrate, the implanting of hydrogen ions is carried out.

9. A process of production of a semiconductor substrate as set forth in claim 1, wherein the step of polishing said semiconductor layer is a chemical mechanical polishing step.

10. A process of production of a semiconductor substrate as set forth in claim 1, further comprising, after the step of forming said first insulating film and before the step of doping the impurity for peeling off said first substrate, a step of forming a conductive film above said first insulating film and a step of forming a second insulating film above said conductive film.

11. A process of production of a semiconductor substrate as set forth in claim 10, wherein the step of forming said second insulating film includes a step of flattening the second insulating film.

12. A process of production of a semiconductor substrate as set forth in claim 11, wherein the step of flattening said second insulating film is a chemical mechanical polishing step.

13. A process of production of a semiconductor device obtained from a semiconductor substrate having a semiconductor layer on an insulating film formed on a substrate, comprising the steps of:

forming a groove of a predetermined depth having a predetermined pattern in a first substrate made of a semiconductor, forming a first insulating film in said groove and above said first substrate, doping an impurity for peeling off said first substrate into a region of a predetermined depth of said first substrate, bonding a second substrate from above said first insulating film, removing said first substrate in the region with said impurity doped therein by heat treatment while leaving the semiconductor layer of the surface layer of said first substrate on said first insulating film, polishing said semiconductor layer using as a stopper the surface of said first insulating film shaped projecting out at a bottom of said groove, and forming a circuit pattern in the obtained semiconductor substrate.

14. A process of production of a semiconductor device as set forth in claim 13, wherein the step of forming said groove includes a step of forming a groove of a depth of 30 to 50 nm in an outer circumferential region of the circuit pattern of the semiconductor chip formed in said semiconductor layer.

15. A process of production off a semiconductor device as set forth in claim 13, wherein the step of forming said groove includes a step of determining the depth of said groove so that the thickness of said semiconductor layer obtained after the stop of polishing said semiconductor layer becomes a predetermined thickness.

16. A process of production of a semiconductor device as set forth in claim 13, wherein the step of forming said first insulating film includes a step of forming the first insulating film by an insulating material with a polishing rate slower than said first substrate.

17. A process of production of a semiconductor substrate as set forth in claim 16, wherein a silicon semiconductor substrate is used as said first substrate and said first insulating film is formed by silicon oxide.

18. A process of production of a semiconductor device as set forth in claim 13, wherein the step of forming said first insulating film includes a step of flattening the first insulating film.

19. A process of production of a semiconductor device as set forth in claim 18, wherein the step of flattening said first insulating film is a chemical mechanical polishing step.

20. A process of production of a semiconductor device as set forth in claim 13, wherein in the step of doping the impurity for peeling off said first substrate, the implanting of hydrogen ions is carried out.

21. A process of production of a semiconductor device as set forth in claim 13, wherein the step of polishing said semiconductor layer is a chemical mechanical polishing step.

22. A process of production of a semiconductor device as sot forth in claim 13, further comprising, after the step of forming said first insulating film and before the step of doping the impurity for peeling off said first substrate, a step of forming a conductive film above said first insulating film and a step of forming a second insulating film above said conductive film.

23. A process of production of a semiconductor device as set forth in claim 22, wherein the step of forming said second insulating film includes a step of flattening the second insulating film.

24. A process of production of a semiconductor device as set forth in claim 23, wherein the step of flattening said second insulating film is a chemical mechanical polishing step.

* * * * *